United States Patent
Yu et al.

(10) Patent No.: US 10,340,282 B1
(45) Date of Patent: Jul. 2, 2019

(54) SEMICONDUCTOR MEMORY DEVICE AND FABRICATION METHOD THEREOF

(71) Applicant: United Microelectronics Corp., Hsinchu (TW)

(72) Inventors: Shu-Hung Yu, Kaohsiung (TW);
Chun-Hung Cheng, Kaohsiung (TW);
Chuan-Fu Wang, Miaoli County (TW);
An-Hsiu Cheng, Pingtung County (TW); Ping-Chia Shih, Tainan (TW);
Chi-Cheng Huang, Kaohsiung (TW);
Kuo-Lung Li, Yunlin County (TW);
Chia-Hui Huang, Tainan (TW);
Chih-Yao Wang, Taichung (TW);
Zi-Jun Liu, Kaohsiung (TW);
Chih-Hao Pan, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/895,886

(22) Filed: Feb. 13, 2018

(51) Int. Cl.
*H01L 21/18* (2006.01)
*H01L 27/1157* (2017.01)
*H01L 21/762* (2006.01)
*H01L 23/528* (2006.01)
*H01L 29/06* (2006.01)

(52) U.S. Cl.
CPC .... *H01L 27/1157* (2013.01); *H01L 21/76224* (2013.01); *H01L 23/528* (2013.01); *H01L 29/0653* (2013.01)

(58) Field of Classification Search
None
See application file for complete search history.

(56) References Cited

U.S. PATENT DOCUMENTS

| | | | |
|---|---|---|---|
| 6,562,681 B2 | 5/2003 | Tuan et al. | |
| 6,989,318 B2 | 1/2006 | Doris et al. | |
| 7,338,880 B2 | 3/2008 | Lim | |
| 7,659,180 B1 | 2/2010 | Khoueir et al. | |
| 7,745,284 B2 | 6/2010 | Hwang et al. | |
| 8,735,959 B2 | 5/2014 | Dornel | |
| 2004/0009645 A1* | 1/2004 | Yoo | H01L 21/28282 438/315 |
| 2016/0141293 A1* | 5/2016 | Murakami | H01L 27/11546 257/324 |
| 2016/0300622 A1* | 10/2016 | Hsu | G11C 17/16 |
| 2017/0194511 A1* | 7/2017 | Chen | H01L 29/6656 |
| 2017/0278953 A1* | 9/2017 | Yang | H01L 21/31155 |

* cited by examiner

*Primary Examiner* — Dung A. Le
(74) *Attorney, Agent, or Firm* — J.C. Patents

(57) ABSTRACT

A semiconductor memory device includes a substrate, having a plurality of cell regions, wherein the cell regions are parallel and extending along a first direction. A plurality of STI structures is disposed in the substrate, extending along the first direction to isolate the cell regions, wherein the STI structures have a uniform height lower than the substrate in the cell regions. A selection gate line is extending along a second direction and crossing over the cell regions and the STI structures. A control gate line is adjacent to the selection gate line in parallel extending along the second direction and also crosses over the cell regions and the STI structures. The selection gate line and the control gate line together form a two-transistor (2T) memory cell.

20 Claims, 5 Drawing Sheets

SEMICONDUCTOR MEMORY DEVICE AND FABRICATION METHOD THEREOF

BACKGROUND

1. Field of the Invention

The present invention generally relates to semiconductor fabrication technology, and particularly to a semiconductor memory device.

2. Description of Related Art

The non-volatile semiconductor memory has been very widely used to store data permanently as the digital information produced by various digital electronic apparatus, such as camera, video apparatus, mobile phone, flat computer, computer system, . . . , and so on. The non-volatile semiconductor memory has been a very popular tool to store a large amount of information.

The digital information is produced more and more in daily life due to the great development of digital electronic apparatus, in an example. So, the memory with large storage capability is really intended. In this situation, the cell size of memory is then needed to be reduced, so to increase the storage capability while the actual volume of the memory may also be reduced for easy carrying. In addition, the performance of the memory cell may get worse, while the cell sized is reduced, in which the memory cell may lose the data as store, or even cannot correctly store the data as to be stored.

As the development on designing the non-volatile memory cell, two-transistor (2T) SONOS memory cell has been proposed, in which SONOS represents a stack of silicon-oxide-nitride-oxide-silicon.

For the 2T SONOS memory cell, it includes a selection transistor and a storage transistor. The selection transistor has a selecting gate and the storage transistor includes the control gate and gate insulating layer for by a structure of ONO (oxide-nitride-oxide) for keeping charges so to store the bit data.

In the conventional fabrication process for the 2T SONOS memory cell, the root levels for the selection gate line and the control gate line on the shallow trench isolation (STI) are not the same, it would cause a poor condition of the control gate line. This may reduce the performance of the 2T SONON memory cell.

The structure in associating with the fabrication process for the 2T SONON memory cell is still under development for improving the performance.

SUMMARY OF THE INVENTION

The invention provides a semiconductor memory device, in which the selection gate line and the control gate line on the shallow trench isolation structure have same bottom level, so to improve the performance. In addition, the shallow trench isolation structure is lower than the substrate at the cell region.

In an embodiment, the invention provides a semiconductor memory device includes a substrate, having a plurality of cell regions, wherein the cell regions are parallel and extending along a first direction. A plurality of STI structures is disposed in the substrate, extending along the first direction to isolate the cell regions, wherein the STI structures have a uniform height lower than the substrate in the cell regions. A selection gate line is extending along a second direction and crossing over the cell regions and the STI structures. A control gate line is adjacent to the selection gate line in parallel extending along the second direction and also crosses over the cell regions and the STI structures. The selection gate line and the control gate line together form a two-transistor (2T) memory cell.

In an embodiment, as to the semiconductor memory device, the control gate line comprises a gate material line and a memory material line, under the gate material line, disposing over the STI structures and the cell regions.

In an embodiment, as to the semiconductor memory device, the memory material line comprises an oxide-nitride-oxide (ONO) storage material.

In an embodiment, as to the semiconductor memory device, the selection gate line comprises a gate material line and a gate insulating line under the gate material line, disposing over the STI structures and the cell regions.

In an embodiment, as to the semiconductor memory device, each cell region further comprises a first S/D region disposed in the substrate at a first outside region, with respect to the selection gate line, a second S/D region disposed in the substrate at a second outside region, with respect to the control gate line. A doped region is in the substrate between the selection gate line and the control gate line.

In an embodiment, as to the semiconductor memory device, a bottom of the selection gate line and a bottom of the control gate line on the STI structures are at same bottom level.

In an embodiment, as to the semiconductor memory device, a top of the selection gate line and a top of the control gate line on the STI structures are at same top level.

In an embodiment, as to the semiconductor memory device, the STI structures are lower than the substrate by a predetermined distance.

In an embodiment, as to the semiconductor memory device, the predetermined distance is in a range of 20 angstroms to 40 angstroms.

In an embodiment, as to the semiconductor memory device, the STI structures comprises a residue of P-type impurities.

In an embodiment, the invention provides a method for fabricating a semiconductor memory device. The method comprises providing a substrate, having a plurality of cell regions, wherein the cell regions are parallel and extending along a first direction. Then, a plurality of shallow trench isolation (STI) structures is formed in the substrate, extending along the first direction to isolate the cell regions. An implanting process is performed on STI structures. A top portion of the STI structures is removed with a uniform height lower than the substrate in the cell regions. A selection gate line is formed, extending along a second direction and crossing over the cell regions and the STI structures. A control gate line is adjacent to the selection gate line in parallel along a second direction, and also crossing over the cell regions and the STI structures. The selection gate line and the control gate line together form a two-transistor (2T) memory cell.

In an embodiment, as to the method, the step of forming the control gate line comprises forming a memory material layer over the STI structures and the cell regions, forming a gate material layer on the memory material layer, patterning the memory material layer and the gate material layer to form the control gate line.

In an embodiment, as to the method, the memory material line comprises an oxide-nitride-oxide (ONO) storage material.

In an embodiment, as to the method, the step of forming the selection gate line comprises forming a gate insulating layer, over the STI structures and the cell regions, forming a gate material layer on the gate insulating layer, and patterning the gate material layer and the gate insulating layer to form the selection gate line.

In an embodiment, for each cell region, the method further comprises forming a first S/D region in the substrate at a first outside region with respect to the selection gate line and a second S/D region in the substrate at a second outside region with respect to the control gate line. A doped region is formed in the substrate between the selection gate line and the control gate line.

In an embodiment, as to the method, a bottom of the selection gate line and a bottom of the control gate line are disposed on the STI structures with same bottom level.

In an embodiment, as to the method, a top of the selection gate line and a top of the control gate line are on the STI structures with same top level.

In an embodiment, as to the method, the step of removing the top portion of the STI structures comprises performing an etching process to etch a top of the STI structures, wherein the STI structures remain same height.

In an embodiment, as to the method, the predetermined distance is in a range of 20 angstroms to 40 angstroms.

In an embodiment, as to the method, the step of performing the implanting process comprises implanting P-type impurities.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to the 2T SONOS memory cell. Several embodiments are provided for describing the invention. However, the invention is not just limited to the embodiments as provided.

Figure 1:
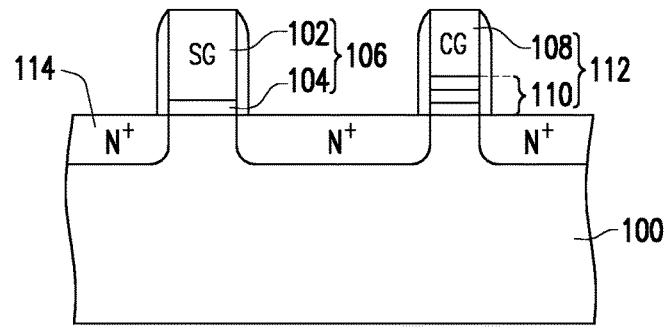
FIG. 1 is a drawing, schematically illustrating a cross-sectional view of a 2T SONOS memory cell, according to an embodiment of the invention.

Before further describing the structure in detail, a 2T SONOS memory cell is provided. FIG. 1 is a drawing, schematically illustrating a cross-sectional view of a 2T SONOS memory cell, according to an embodiment of the invention.

Referring to FIG. 1, a is provided. In an example, the substrate 100 can be silicon wafer or silicon fin of a wafer. One 2T SONOS memory cell include a selection gate (SG) line 106 and a control gate (CG) line 112, adjacently disposed on the substrate 100. The doped regions 114 of N+ doping level are formed in the substrate at both sides of the selection gate line 106 and the control gate line 112.

The outer two doped regions 114 at outer side of the selection gate line 106 and the outer side of the control gate line 112 serve as source/drain (S/D) regions. The doped region 114 between the selection gate line 106 and the outer side of the control gate line 112 are common doped region for connecting the selection transistor and the control transistor. The selection gate line 106 usually includes a gate material line 102 and the gate insulating line 104, such as gate oxide. The control gate line 112 includes a gate material line 108 and a memory material line 110. The memory material line 110 in an example is an oxide-nitride-oxide (ONO) stack, so to trap the charges. Whether or not the charges are trapped would determine the data as stored. In addition, a spacer is also formed on side wall of the selection gate line 106 and the control gate line 112.

Figure 2A:
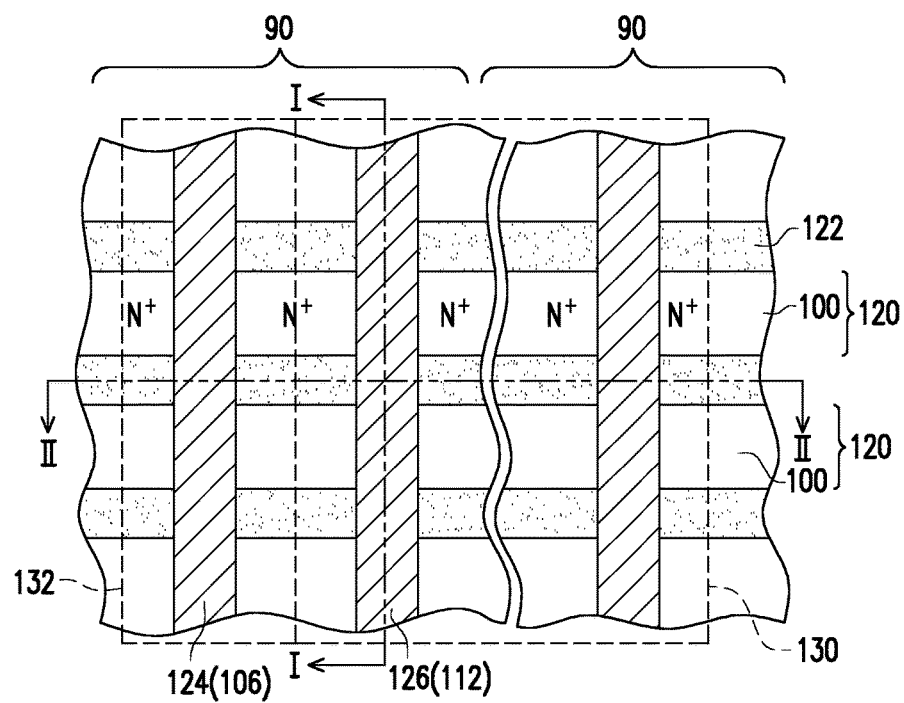
FIG. 2A is a drawing, schematically illustrating a layout of 2T SONOS memory cell, according to an embodiment of the invention.
Figure 2B:
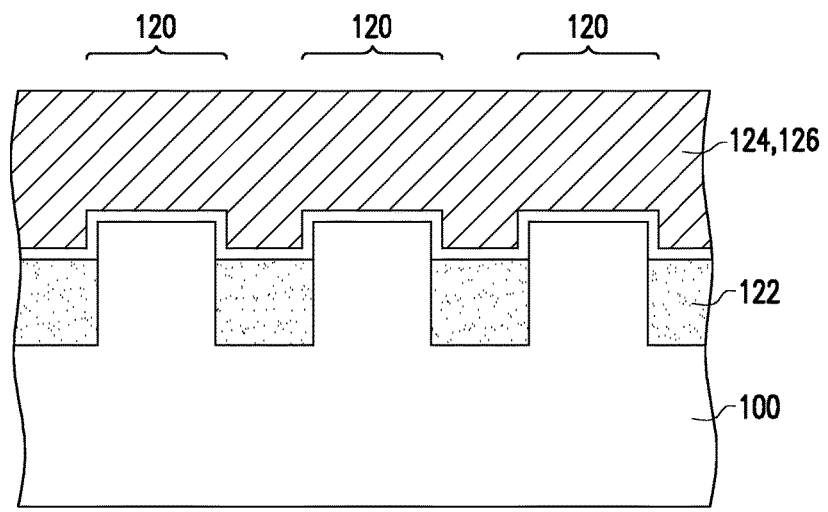
FIG. 2B is a drawing, schematically illustrating a cross-sectional view of 2T SONOS memory cells along the cut line I-I in FIG. 2A.

As the 2T SONO memory cell is formed, a part of the layout is further described as follows. FIG. 2A is a drawing, schematically illustrating a layout of 2T SONOS memory cell, according to an embodiment of the invention. FIG. 2B is a drawing, schematically illustrating a cross-sectional view of 2T SONOS memory cells along the cut line I-I in FIG. 2A.

Referring to FIG. 2A and partly referring to FIG. 2B, in fabrication, two 2T SONOS memory cells 90 are formed together, so to have the sequence of SG-CG-CG-Sg- . . . SG, in an example.

Generally, the substrate 100 has a plurality of cell regions 120, wherein the cell regions 120 are parallel and extending along a horizontal direction in the drawing sheet. A plurality of shallow trench isolation (STI) structures 122 is disposed in the substrate 100, also extending along the horizontal direction to isolate the cell regions 120.

The STI structures 122 have a uniform height lower than the substrate 100 in the cell regions 120. A selection gate line 124, 106 is extending along a vertical direction and crossing over the cell regions 120 and the STI structures 122. A control gate line 126, 112 is adjacent to the selection gate line 124 in parallel extending along the vertical direction, also crossing over the cell regions 120 and the STI structures 122. The selection gate line 124 and the control gate line 126 together form a 2T memory cell 90.

The invention has looked into the potentially issue existing in the 2T SONOS memory cell and proposed an improvement.

Figure 3:
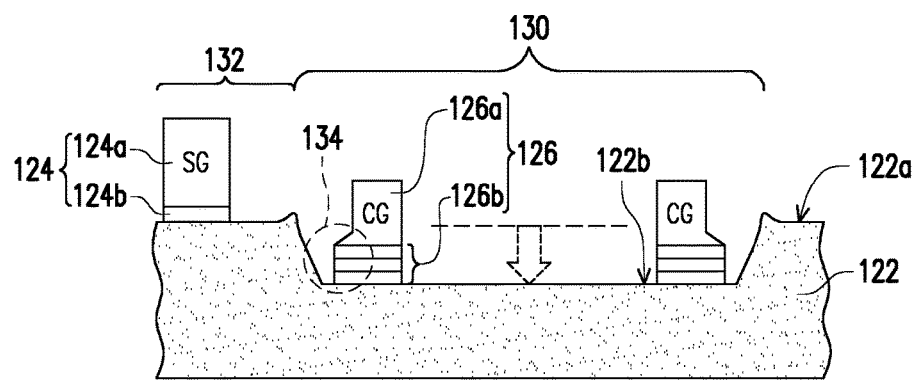
FIG. 3 is a drawing, schematically illustrating a cross-sectional view of 2T SONOS memory cells along the cut line II-II in FIG. 2A, according to an embodiment of the invention.

FIG. 3 is a drawing, schematically illustrating a cross-sectional view of 2T SONOS memory cells along the cut line II-II in FIG. 2A, according to an embodiment of the invention.

Referring to FIG. 2B and FIG. 3, the cross-section structure of memory cells along the cut line II-II in FIG. 2A would have different structure depending on the procedure to fabricate the memory cell.

The control gate line 126 includes a gate material line 126a, such as polysilicon gate, and the memory material line 126b, which is ONO structure being thicker in an example. In one configuration of FIG. 3 as an example, the STI structure 122 at the CG region 130 has a recess (indicated by arrow) to adapt the control gate line 126. The selection gate line 124 at the SG region 132 has the usual gate material line 124a and the gate insulating line 124b. In a usual way, the STI structure 122 at the SG region 132 is not recessed. As a result, the surface 122a of the STI structure 122 at the SG region 132 is higher than the surface 122b of the STI structure 122 at the CG region 130.

The invention has looked into the issue of recess occurring on the STI structure 122 at the CG region 130 and addressed some issues. It has been observed by the invention that the control gate line 126 at the CG region 132 with recess may have defect 134, occurring at the bottom. Further, the STI structure usually is not smooth (with protruding) at the recess rim. The issues above as investigated by the invention may reduce the performance of the memory cell.

Figure 4:
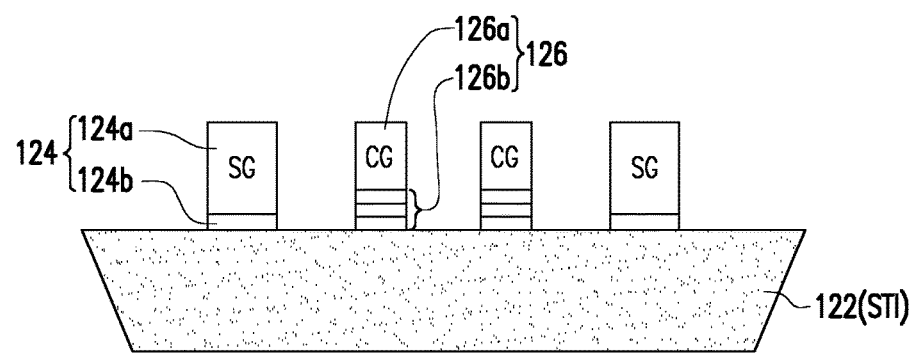
FIG. 4 is a drawing, schematically illustrating a cross-sectional view of 2T SONOS memory cells along the cut line II-II in FIG. 2A, according to an embodiment of the invention.

The invention has proposed a further fabrication procedure to at least reduce the issues above. FIG. 4 is a drawing, schematically illustrating a cross-sectional view of 2T SONOS memory cells along the cut line II-II in FIG. 2A, according to an embodiment of the invention.

Referring to FIG. 4, the STI structure 122 in the fabrication procedure of the invention, according to an embodiment, has a uniform height in the SG region and the CG region, so that the SG line 124 and the CG line 126 have the same root level on the STI structure 122. Also, the CG line 126 can be formed with usual geometric shape without causing the defect 134 seen in FIG. 3. The SG line 124 and the CG line 126 has the same height for top.

Figure 5:
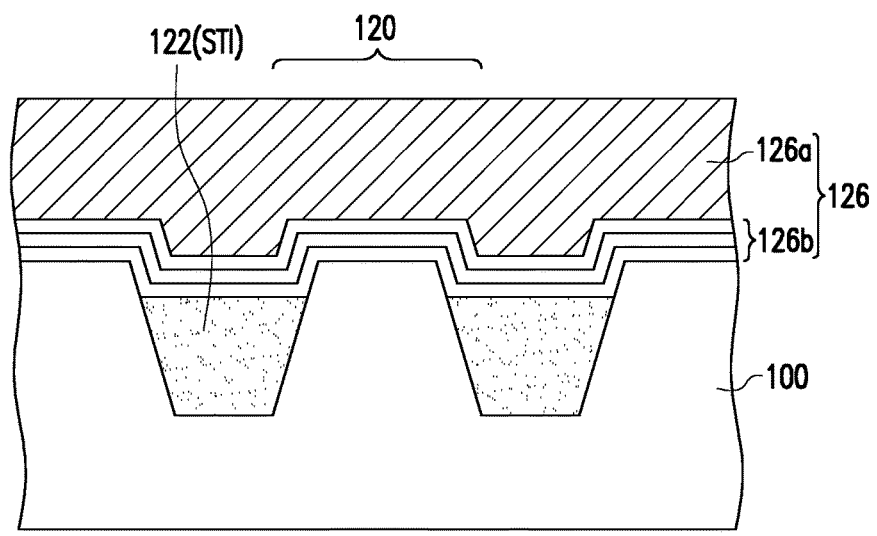
FIG. 5 is a drawing, schematically illustrating a cross-sectional view of 2T SONOS memory cells along the control gate line, according to an embodiment of the invention.

FIG. 5 is a drawing, schematically illustrating a cross-sectional view of 2T SONOS memory cells along the control gate line, according to an embodiment of the invention.

Referring to FIG. 5, the STI structure 122 are recessed at the SG region 132 and the CG region 130 together. This implies that the top of the STI structure 122 is lower than the top of the fin at the cell region 120 of the substrate 100. Similar to FIG. 2B, the fin protrudes out from the STI structure 122 with more contact area with the SG line 124 and the CG line 126. The increase of the contact area can increase the active area and then improve performance of the transistor.

Figure 6A:
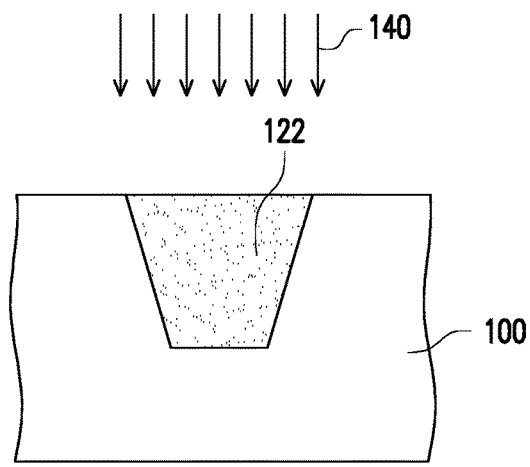
FIG. 6A and FIG. 6B are drawings, schematically illustrating a cross-sectional view of 2T SONOS memory cell for etching the STI between the silicon fins, according to an embodiment of the invention.
Figure 6B:
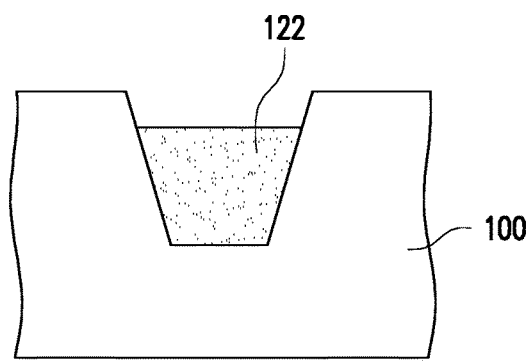

As to the procedure to get recess of the STI structure 122, it is described as follows. FIG. 6A and FIG. 6B are drawings, schematically illustrating a cross-sectional view of 2T SONOS memory cell for etching the STI between the silicon fins, according to an embodiment of the invention.

Referring to FIG. 6A, The STI structures 122 between the fins of the cell region 120 are usually formed together with the STI structure in other part by surrounding the device structure. In this situation, the STI structure 122 at this stage is higher or the same height to the substrate 100 at cell region 120. The example with same height is taken here. An implantation process 140 can be taken to implant P-type impurities on the surficial region of the STI structure 122 at the SG region 124 and the CG region 126, so to make the material of the STI structure to be softer. The P-type impurities in an example, can be carbon, boron, Ge, $BF_2$, . . . , et al.

Referring to FIG. 6B, after implantation, the surface part of the STI structure at the SG region 132 and the CG region 130 can be simply etched away by wet etching with etchants of diluted hydrofluoric acid (DHF) or Buffered Oxide Etch (BOE). In other words, the STI structure 122 may contain the residue of the P-type impurity.

Figure 7:
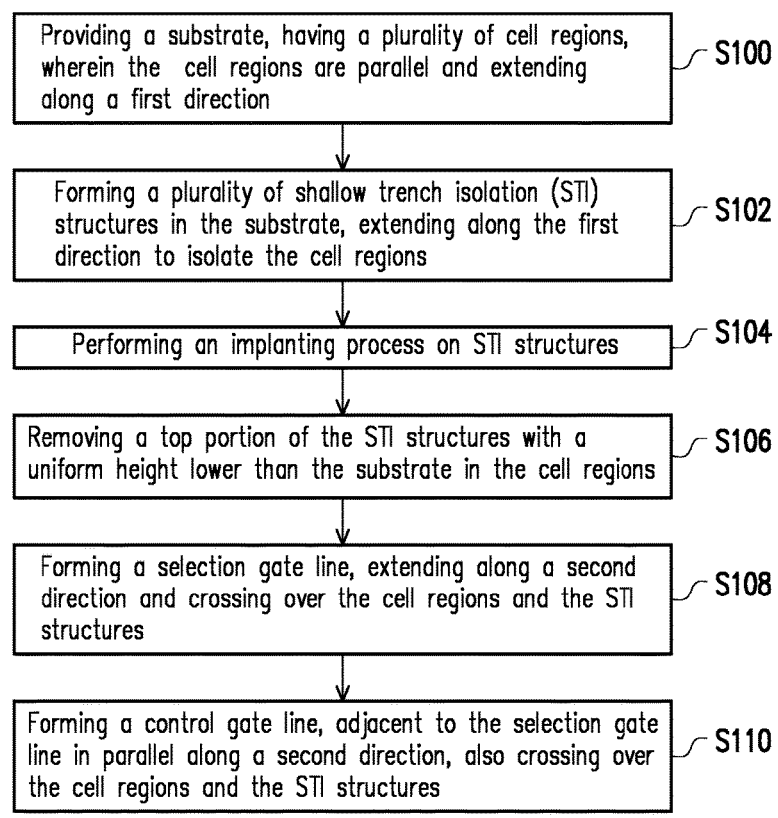
FIG. 7 is a drawing, schematically illustrating a processing flow of a method for fabricating a 2T SONOS memory cell, according to an embodiment of the invention.

Further viewing on fabrication process, FIG. 7 is a drawing, schematically illustrating a processing flow of a method for fabricating a 2T SONOS memory cell, according to an embodiment of the invention.

Referring to FIG. 7, the method for fabricating a semiconductor memory device comprises step S100, providing a substrate, having a plurality of cell regions, wherein the cell regions are parallel and extending along a first direction. Further, in step S102, a plurality of shallow trench isolation (STI) structures are formed in the substrate, extending along the first direction to isolate the cell regions. In step S104, an implanting process is performed on the STI structures. In step S106, a top portion of the STI structures is removed to have a uniform height lower than the substrate in the cell regions. In step S108, a selection gate line is formed, extending along a second direction and crossing over the cell regions and the STI structures. In step S110, a control gate line is formed, adjacent to the selection gate line in parallel along a second direction, also crossing over the cell regions and the STI structures.

The invention makes the SG line and the CG line in 2T SONONS memory cell to be at the same root level and the same height and the performance can thereby be improved.

The process may use implanting process to implant the STI structure at the SG region and the CG region in the memory cell, then the etching process etches the STI to remove a top portion of the STI, so to have the same root height for the SG line and the CG line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor memory device, comprising:
   a substrate, having a plurality of cell regions, wherein the cell regions are parallel and extending along a first direction;
   a plurality of shallow trench isolation (STI) structures, disposed in the substrate, extending along the first direction to isolate the cell regions, wherein the STI structures have a uniform height lower than the substrate in the cell regions;
   a selection gate line, extending along a second direction and crossing over the cell regions and the STI structures; and
   a control gate line, adjacent to the selection gate line in parallel extending along the second direction, also crossing over the cell regions and the STI structures, wherein the selection gate line and the control gate line together form a two-transistor (2T) memory cell.

2. The semiconductor memory device of claim 1, wherein the control gate line comprises:
   a gate material line; and
   a memory material line, under the gate material line, disposing over the STI structures and the cell regions.

3. The semiconductor memory device of claim 2, wherein the memory material line comprises an oxide-nitride-oxide storage material.

4. The semiconductor memory device of claim 1, wherein the selection gate line comprises:
   a gate material line; and
   a gate insulating line, under the gate material line, disposing over the STI structures and the cell regions.

5. The semiconductor memory device of claim 1, wherein each cell region further comprises:
   a first S/D region disposed in the substrate at a first outside region, with respect to the selection gate line;
   a second S/D region disposed in the substrate at a second outside region, with respect to the control gate line; and
   a doped region disposed in the substrate between the selection gate line and the control gate line.

6. The semiconductor memory device of claim 1, wherein a bottom of the selection gate line and a bottom of the control gate line on the STI structures are at same bottom level.

7. The semiconductor memory device of claim 6, wherein a top of the selection gate line and a top of the control gate line on the STI structures are at same top level.

8. The semiconductor memory device of claim 1, wherein the STI structures are lower than the substrate by a predetermined distance.

9. The semiconductor memory device of claim 8, wherein the predetermined distance is in a range of 20 angstroms to 40 angstroms.

10. The semiconductor memory device of claim 8, wherein the STI structures comprises a residue of P-type impurities.

11. A method for fabricating a semiconductor memory device, comprising:
   providing a substrate, having a plurality of cell regions, wherein the cell regions are parallel and extending along a first direction;
   forming a plurality of shallow trench isolation (STI) structures in the substrate, extending along the first direction to isolate the cell regions;
   performing an implanting process on the STI structures;
   removing a top portion of the STI structures with a uniform height lower than the substrate in the cell regions;
   forming a selection gate line, extending along a second direction and crossing over the cell regions and the STI structures; and
   forming a control gate line, adjacent to the selection gate line in parallel along a second direction, also crossing over the cell regions and the STI structures,
   wherein the selection gate line and the control gate line together form a two-transistor (2T) memory cell.

12. The method of claim 11, wherein the step of forming the control gate line comprises:
   forming a memory material layer over the STI structures and the cell regions;
   forming a gate material layer on the memory material layer; and
   patterning the memory material layer and the gate material layer to form the control gate line.

13. The method of claim 12, wherein the memory material line comprises an oxide-nitride-oxide (ONO) storage material.

14. The method of claim 11, wherein the step of forming the selection gate line comprises:
   forming a gate insulating layer, over the STI structures and the cell regions;
   forming a gate material layer on the gate insulating layer; and
   patterning the gate material layer and the gate insulating layer to form the selection gate line.

15. The method of claim 11, for each cell region, further comprising:
   forming a first S/D region in the substrate at a first outside region with respect to the selection gate line and a second S/D region in the substrate at a second outside region with respect to the control gate line; and
   forming a doped region in the substrate between the selection gate line and the control gate line.

16. The method of claim 11, wherein a bottom of the selection gate line and a bottom of the control gate line are on the STI structures with same bottom level.

17. The method of claim 16, wherein a top of the selection gate line and a top of the control gate line are on the STI structures with same top level.

18. The method of claim 11, wherein the step of removing the top portion of the STI structures comprises:
   performing an etching process to etch a top of the STI structures, wherein the STI structures remain same height.

19. The method of claim 18, wherein the predetermined distance is in a range of 20 angstroms to 40 angstroms.

20. The method of claim 18, the step of performing the implanting process comprises implanting P-type impurities.

* * * * *